United States Patent [19]

Weston

[11] 3,786,556

[45] Jan. 22, 1974

[54] MOUNTING SEMICONDUCTOR BODIES

[75] Inventor: Alan David Weston, Southampton, England

[73] Assignee: U.S. Philips Corporation, New York, N.Y.

[22] Filed: Dec. 10, 1971

[21] Appl. No.: 206,620

[30] Foreign Application Priority Data

Dec. 15, 1970 Great Britain .................. 59,436/70

[52] U.S. Cl. ...................... 29/473.1, 29/500, 29/589

[51] Int. Cl. ............................................ B23k 31/02

[58] Field of Search .......... 29/473.1, 500, 589, 590; 317/234

[56] References Cited

UNITED STATES PATENTS

| | | | |
|---|---|---|---|
| 3,060,553 | 10/1962 | Kelley | 29/589 |
| 3,204,327 | 9/1965 | Costa | 317/234 UX |
| 3,217,213 | 11/1965 | Slater | 317/234 UX |
| 3,411,193 | 11/1968 | Tokacs | 29/589 X |
| 3,512,051 | 5/1970 | Noll | 29/500 UX |
| 3,528,102 | 9/1970 | Rodet et al. | 29/589 X |

OTHER PUBLICATIONS

L. F. Miller et al., "Nonconcentric Solder Reflow Technique For Close-Packed Lands," IBM Technical Disclosure Bulletin, Vol. 13, No. 1, June 1970.

*Primary Examiner*—J. Spencer Overholser
*Assistant Examiner*—Ronald J. Shore
*Attorney, Agent, or Firm*—Frank R. Trifari

[57] ABSTRACT

Method of securing a semiconductor body to a support surface comprising steps of placing semiconductor body face in contact with surface with at least one solder body on the surface and spaced laterally from the semiconductor body, melting solder to cause it to flow by capillary action between the body face and support surface, and cooling solder to provide intermediate layer between the surface and the body face. Also, a product made by this method.

7 Claims, 12 Drawing Figures

MOUNTING SEMICONDUCTOR BODIES

This invention relates to methods of securing a semiconductor body to a support by soldering.

In the manufacture of semiconductor devices, for example transistors and semiconductor integrated circuits, it is common practice to secure on a support a wafer-shaped semiconductor body in which the regions of the circuit element or elements have been formed. The support, generally referred to as a header, may comprise a metal base having a mounting surface for the semiconductor body and a plurality of mutually insulated lead-in conductors to which connection wires can be secured at one end, the other ends of the connection wires being secured to connection areas on the semiconductor body, for example by thermocompression bonding or ultrasonic bonding.

For devices having a relatively high dissipation various techniques have been evolved for securing the semiconductor body on a mounting surface on the header. Some of these techniques are based on the inclusion of a disc of molybdenum between the semiconductor body and the mounting surface on the header which may consist in part, for example, of copper. The latter method is particularly relevant for mounting silicon semiconductor bodies as the thermal expansion coefficient of molybdenum more closely matches that of silicon and provides a certain degree of protection for the silicon body against thermal shock. This method normally involves the eutectic bonding of the silicon body to the molybdenum disc at elevated temperature, for example using an intermediately situated gold layer, and the subsequent soft soldering of the molybdenum disc to the copper header part. This technique, although yielding devices of suitable properties is expensive in manufacture and therefore methods have been evolved to secure the semiconductor body directly to the mounting surface on the header using an intermediately situated solder preform. In such a method a solder preform, for example of an alloy lead, silver and tin is placed between a gold on nickel plated surface of a copper part of a header and a silver on titanium plated surface of a silicon semiconductor body prior to heating the assembly at approximately 380° C to effect the soldering of the silicon body to the gold plated copper header part. This method although having the potential of providing a cost reduction has not been found to be entirely satisfactory because under high thermal stress a deterioration of the contact between the silicon body and the header occurs. Examination by metallurgical section of devices manufactured when using such a method has revealed some cracking of the soldered region, accompanied by evidence of poor wetting of the silver surface on the silicon body, in some instances associated with void formation. When the silicon body is in the form of a discrete transistor element the poor wetting characteristic is particularly undesirable as the area of poor wetting is critically situated directly below the area of the emitter region and it is in this area of the solder contact where the presence of irregularities is most deleterious. Further analysis of the solder region has revealed the presence of a vertical column of dissimilar material extending throughout the central part of the solder region. It is concluded that during the heating process used to effect the soldering various interdiffusion mechanisms occur between the various elements present in the solder material and at the adjoining surfaces of the silicon body and header with the possible formation of undesirable intermetallics at localised areas of the solder region.

According to the invention in a method of securing a semiconductor body on a support by soldering, the semiconductor body and at least one body of solder material are located at a surface of the support with the solder body or bodies situated at the side of the semiconductor body leaving the area of the surface of the support below the semiconductor body free or substantially free of the solder body or bodies, the support and bodies thereon being heated to a temperature in excess of the melting point of the solder material for a time sufficient to cause flow of solder material on the surface of the support and by capillary action between the facing surfaces of the semiconductor body and support to form an intermediate solder layer between said facing surfaces which solder layer on cooling secures the semiconductor body to the support.

In this method which may be termed 'capillary flow soldering' various advantages arise compared with the previously described method in which the solder body is positioned wholly between the facing surfaces prior to heating. Firstly during the heating, for example effected in a hydrogen atmosphere, the upper surface of the solder body or bodies is exposed and volatile impurities released from the solder material are free to escape and render the liquid solder material substantially clean and mobile. Flow of the solder material may be induced in a preferred direction during melting of the solder body or bodies, the molten solder material spreading under the semiconductor body by capillary action between the facing surfaces of the semiconductor body and the support. This flow may be effective to sweep out any occluded gases between the facing surfaces. A better distribution of intermetallics is obtained due to the movement of the liquid solder material, the less mobile constituents remaining at the original location of the solder material and thereby being kept from occlusion between the facing surfaces.

In a preferred form of the method the semiconductor body and solder body or bodies are located at the surface of the support so that the facing surfaces of the semiconductor body and support are in direct contact. In this form the complete upper surface area of the solder body or bodies is exposed during the heating prior to the flow of the molten solder material and thus a more complete release of the volatile impurities from the solder material can be effected. In this form the semiconductor body may be situated immediately adjacent to the solder body or bodies but preferably the semiconductor body is spaced laterally from the solder body or bodies in order to avoid any undesired wetting of the sides of the semiconductor body by the solder material.

In another form of the method the semiconductor body and solder body or bodies may be located at the surface of the support so that the facing surfaces of the semiconductor body and support are spaced apart, the semiconductor body resting on a peripheral portion or portions of the solder body or bodies, for example the semiconductor body may be in the form of a thin wafer of square outline which is located on the edges of two solder preform discs situated on the surface of the support at opposite sides of the wafer. In this form of the method, although the area of the surface of the support below the facing surface of the semiconductor body is not entirely free of the solder body or bodies, the subsequent flow of the molten solder material will still drive out any occluded gas between the initially spaced apart facing surfaces. As the semiconductor body only rests on a peripheral portion or portions of the solder body or bodies, the possibility of rendering the solder material free of volatile impurities still exists.

Although a single solder body may be employed in a preferred form of the method in accordance with the invention a plurality of solder bodies are situated on the support surface and are substantially symmetrically disposed with respect to the semiconductor body. Thus in one form two solder bodies in the form of regular shaped preforms are disposed at opposite sides of the semiconductor body. The semiconductor body may be of substantially square outline and the two solder bodies may consist of preform discs which are situated at opposite sides of the body. The size of such solder preforms and their lateral situation with respect to the facing surfaces is chosen, inter alia, in accordance with the area between the facing surfaces, the surface activity of the support surface, the heating temperature employed, the gas ambient and cleanliness, and the composition of the solder material.

At least two solder bodies in the form of wires may be used. Provided the wires can be obtained having a sufficiently large enough diameter, this may represent a cheap way in which to apply the solder bodies.

A single solder body may be used which at the surface of the support partially but not wholly surrounds the semiconductor body. In this manner occluded gases between the facing surface can be swept out whilst using only a single solder body.

The method may be employed when the semiconductor body is of silicon and at least the part of the support to which the semiconductor body is to be secured is of copper. the surface of the copper support part may comprise a layer of gold on a layer of nickel or cobalt and the material of the solder body or bodies consists essentially of an alloy of lead, silver and tin.

Prior to placing the silicon body of the surface of the support, at the facing surface of the silicon body there may be applied, for example by evaporation deposition, a layer of titanium on the silicon and a layer of silver on the titanium.

Embodiments of the invention will now be described, by way of example, with reference to the accompanying diagrammatic drawings, in which.

Figure 1:
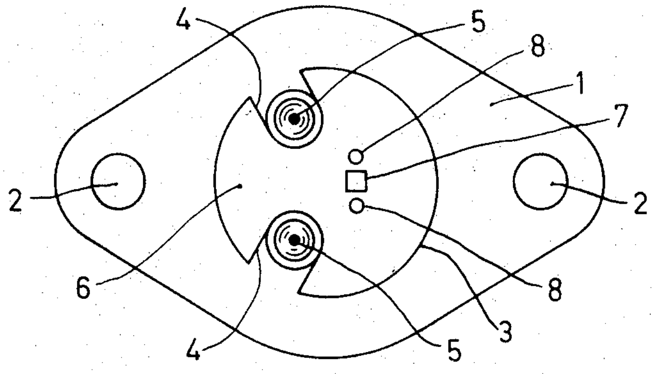
FIG. 1 is a plan view of a header part of an envelope for a transistor and showing on a supporting surface thereof a silicon transistor body and two solder preforms.

The header shown in FIG. 1 is of a standard outline, known generally as TO-3 and comprises a base plate 1 of steel having two mounting apertures 2. On the upper surface of the steel base plate 1 there is secured a copper disc 3 of approximately 1.65 mm. thickness and approximately 17.5 mm. diameter. The copper disc 3 has two recessed portions 4 within which raised tubular portions of the steel base plate extend. Within each raised tubular portion there is a lead-in conductor wire 5 of nickel/iron which is sealed in the tubular portion by a glass to metal seal. The copper disc 3 comprises an upper supporting surface 6 which together with the remaining metal parts of the header has been provided with a plating of nickel of approximately 3 microns thickness followed by a plating of gold of approximately 0.1 micron thickness. Prior to soldering a silicon transistor body to the supporting surface 6 the header is heated in a furnace in a hydrogen atmosphere to stabilise the surface activity of the header, the peak temperature being approximately 375° C and the total heating and cooling cycle lasting 30 minutes.

On the supporting surface 6 there are positioned a silicon transistor body 7 and two solder preforms 8. The silicon transistor body is, for example, an epitaxial planar *n-p-n* transistor in which the collector contact is established via the lower surface of the body and the emitter and base electrodes are on the upper surface of the body. Prior to applying the silicon body 7 to the surface 6, the lower surface of the silicon body is subjected to an evaoration step to apply a layer of titanium of approximately 0.1 micron thickness followed by a layer of silver of approximately 1.0 micron thickness, the evaporation step being performed on a plurality of such bodies whilst still present in an undivided silicon slice. The body 7 is of 1.6 mm. × 1.6 mm. and of approximately 250 microns thickness. The solder preforms 8 consist of discs of 1.0 mm. diameter and 50 microns thickness of a solder alloy material containing by weight 95.5 percent lead, 3.0 percent silver and 1.5 percent tin, this material having a Solidus of 294° C and Liquidus of 315° C.

Figure 2:
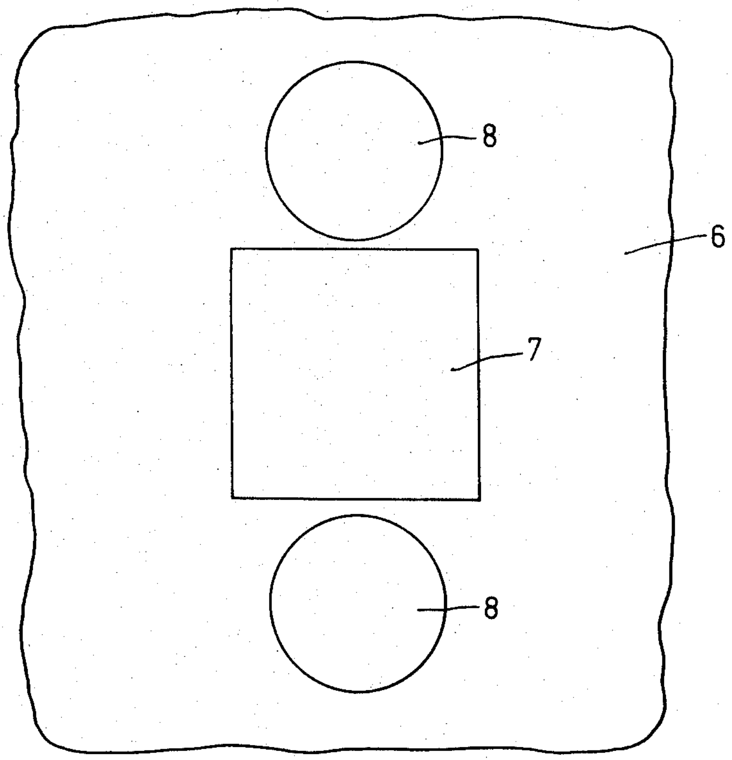
FIG. 2 is an enlarged plan view showing the part of the supporting surface of the header of FIG. 1 having the silicon transistor body and solder preforms thereon.

FIG. 2 is an enlarged plan view of the part of the supporting surface 6 having the silicon body 7 and the solder preforms 8 thereon, the preforms 8 being symmetrically disposed with respect to the body 7. The centres of the preforms at opposite sides of the body 7 are spaced by distance of approximately 3.0 mm.

Figure 3:
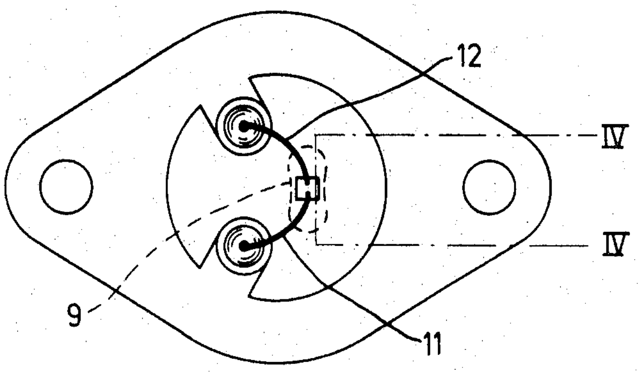
FIG. 3 is a plan view of the header of FIGS. 1 and 2 subsequent to carrying out the method in accordance with the invention for securing the silicon transistor body to the supporting surface and subsequent to making wire bond connections to emitter and base electrodes on the silicon transistor body.

A plurality of the headers as shown in FIGS. 1 and 2 are then loaded onto a moving belt which passes into a hump-back furnace. Heating is effected in a hydrogen atmosphere, the maximum temperature being 380° C and the total cycle time being 30 minutes. The time the header and bodies thereon are at a temperature above the solidus of the solder material is approximately 5 minutes. During the heating step the whole top surfaces of the preforms are exposed to the hydrogen atmosphere before and during melting. Volatile impurities are released from the solder material and the liquid solder formed is clean and mobile. The liquid solder spreads out on the surface 6, the molten material of the two preforms approaching the silicon body 7 from opposite sides. On reaching the silicon body 7 the solder penetrates between the facing surfaces of the header and silicon body by capillary action. In doing so, occluded gases under the silicon body are swept outwards. The quantity of solder material is chosen to be sufficient to provide for a complete penetration of the liquid solder material by capillary action under the silicon body 7. FIG. 3 shows in broken line the outward extent of the spreading of the liquid solder 9. On cooling, the solder layer formed by capillary action between the facing surfaces of the silicon body and header adheres well to both facing surfaces and is found to be substantially free of voids and has no undesirable distribution of intermetallics.

Figure 4:
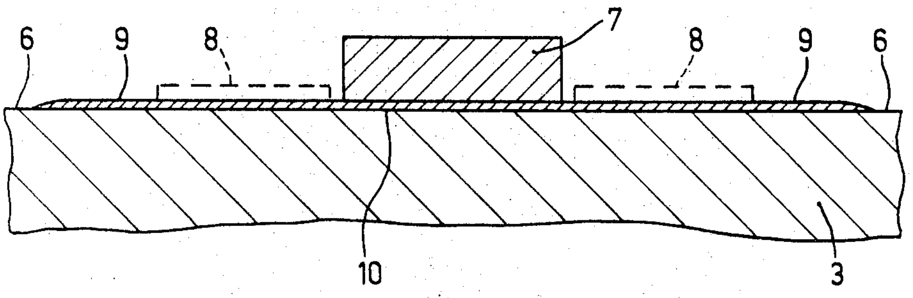
FIG. 4 is a cross section through part of the header taken on the line IV — IV of FIG. 3, and FIGS. 5 to 12 inclusive show in plan view various other configurations of solder bodies and semiconductor bodies applied to a supporting surface.

FIG. 4 shows in section the initial position of the preforms 8 in broken line, the final extent of the flowed solder layer 9 and the layer part 10 formed by capillary action between the facing surfaces of the body 7 and the plated copper disc 3.

As a subsequent stage in the manufacture wires 11 and 12 are ultrasonically bonded at one end to the emitter and base electrodes on the upper surface of the silicon body 9 and at the opposite ends to the lead-in terminal posts 5. The device encapsulation is completed by the securing of a metal can over the copper disc 3, the lip of the metal can being welded to the steel plate 1.

Further configurations of solder bodies and the semiconductor body on a supporting surface for use in a method in accordance with the invention will now be described briefly, by way of example, with reference to FIGS. 5 to 12 inclusive. These Figures correspond to the plan view of FIG. 2, the semiconductor body 7 being of similar dimensions but the solder bodies differing in shape and/or position. Otherwise the steps of the method are substantially as described in the previous embodiment.

Figure 5:
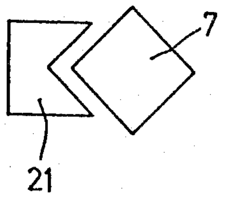

FIG. 5 shows a single solder preform 21 having a recessed portion the sides of which are parallel to the two adjoining sides of the semiconductor body.

Figure 6:
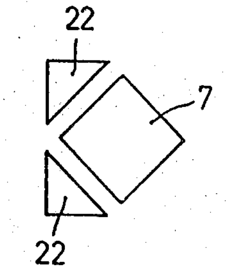
Figure 7:
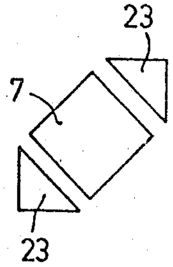

FIG. 6 shows two triangular solder preforms 22 facing adjacent sides of the semiconductor body 7 and FIG. 7 shows two similar triangular solder preforms 23 facing opposite sides of the semiconductor body 7.

Figure 8:
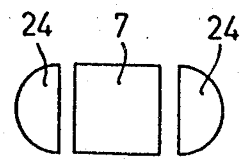

FIG. 8 shows two semicircular disc preforms 24 situated at opposite sides of the semiconductor body 7.

Figure 9:
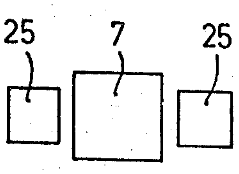

FIG. 9 shows two square solder preforms 25 situated at opposite sides of the semiconductor body 7.

Figure 10:
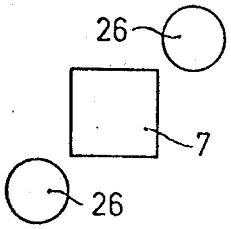
Figure 11:
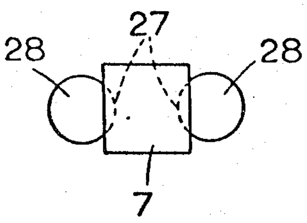

FIG. 10 shows two solder preform discs 26 having their line of centres coincident with a diagonal of the semiconductor body 7.

In another possible modification (FIG. 11) initially the facing surfaces of the semiconductor body 7 and the supporting surface are spaced apart. The semiconductor body rests on peripheral portions 27 of two solder preform discs 28 situated at opposite sides of the body 7. Other configurations are possible with the facing surfaces of the semiconductor body and supporting surface spaced apart initially, for example semicircular discs as shown in Figure 8 may be used at opposite sides of the semiconductor body with the semiconductor body resting on peripheral circumferential portions of the discs.

Figure 12:
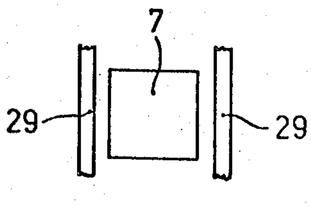

FIG. 12 shows two solder bodies in the form of wires 29 situated at opposite sides of the semiconducor body 7.

Many further variations are possible within the scope of the invention as defined in the appended claims. For example, the securing of the semiconductor body may be onto a TO-3 outline header of different structure or een onto a surface of an envelope part of a completely different outline. Semiconductor bodies of devices other than transistors may be soldered to the supporting surface, for example silicon integrated circuit bodies. Different solder materials may be used, the choice of the solder material being determined, inter alia, by the melting point and the material of the facing surfaces of the semiconductor body and support. For silicon bodies instead of applying a gold layer on the titanium layer on the lower surface a silver layer may be applied to the titanium layer. The si lver layer may be provided with a very thin flash of gold.

What we claim is: -

1. A method of securing a semiconductor body to a support surface, comprising the steps of:
   a disposing said body on said surface so that a face of said body contacts at least a part of said surface,
   b disposing on said surface at least one body of solder material, said solder body being spaced laterally from said semi-conductor body;
   c heating said solder body to a temperature exceeding the melting point thereof so that molten solder material flows by capillary action over said part of said surface; and
   d cooling said solder material so as to provide an intermediate solder layer at least between said surface part and said semiconductor body face.

2. A method as recited in claim 1, wherein a plurality of said bodies of solder material are situated on said support surface and are substantially symmetrically disposed with respect to said semiconductor body.

3. A method as recited in claim 1, wherein two solder bodies are disposed at opposite sides of said semiconductor body.

4. A method as recited in claim 1, wherein a single solder body is used, said solder body only partially surrounding said semiconductor body.

5. A method as recited in claim 1, wherein said semiconductor body is of silicon and at least the part of said support to which said semiconductor body is to be secured is of copper.

6. A method as recited in claim 5, wherein the surface of said copper support part comprises a layer of gold on a layer of one of nickel and cobalt and said solder body consists essentially of an alloy of lead, silver and tin.

7. A method as claimed in claim 6, wherein prior to locating said semiconductor body at said support surface, a layer of titanium is provided at said face of said silicon semiconductor body and a layer of silver is provided on said titanium layer.

* * * * *